(12) United States Patent
Lai et al.

(10) Patent No.: US 8,264,021 B2
(45) Date of Patent: Sep. 11, 2012

(54) FINFETS AND METHODS FOR FORMING THE SAME

(75) Inventors: Li-Shyue Lai, Jhube (TW); Tsz-Mei Kwok, Hsinchu (TW); Chih Chieh Yeh, Taipei (TW); Clement Hsingjen Wann, Carmel, NY (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 147 days.

(21) Appl. No.: 12/761,686

(22) Filed: Apr. 16, 2010

(65) Prior Publication Data

US 2011/0079829 A1   Apr. 7, 2011

Related U.S. Application Data

(60) Provisional application No. 61/247,756, filed on Oct. 1, 2009.

(51) Int. Cl.
*H01L 29/78* (2006.01)
*H01L 21/336* (2006.01)

(52) U.S. Cl. .............. 257/288; 257/E29.255; 438/294

(58) Field of Classification Search .............. 257/213, 257/288, E29.255, E21.409; 438/294
See application file for complete search history.

(56) References Cited

U.S. PATENT DOCUMENTS

| 5,581,202 A | 12/1996 | Yano et al. |
| 5,658,417 A | 8/1997 | Watanabe et al. |
| 5,767,732 A | 6/1998 | Lee et al. |
| 5,963,789 A | 10/1999 | Tsuchiaki |
| 6,065,481 A | 5/2000 | Fayfield et al. |
| 6,121,786 A | 9/2000 | Yamagami et al. |
| 6,299,724 B1 | 10/2001 | Fayfield et al. |
| 6,503,794 B1 | 1/2003 | Watanabe et al. |
| 6,613,634 B2 | 9/2003 | Ootsuka et al. |
| 6,622,738 B2 | 9/2003 | Scovell |
| 6,642,090 B1 | 11/2003 | Fried et al. |
| 6,706,571 B1 | 3/2004 | Yu et al. |
| 6,727,557 B2 | 4/2004 | Takao |
| 6,740,247 B1 | 5/2004 | Han et al. |
| 6,743,673 B2 | 6/2004 | Watanabe et al. |
| 6,762,448 B1 * | 7/2004 | Lin et al. .................. 257/302 |
| 6,828,646 B2 | 12/2004 | Marty et al. |
| 6,830,994 B2 | 12/2004 | Mitsuki et al. |

(Continued)

FOREIGN PATENT DOCUMENTS

CN   101179046   5/2005

(Continued)

OTHER PUBLICATIONS

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

(Continued)

*Primary Examiner* — Victor A Mandala
*Assistant Examiner* — Selim Ahmed
(74) *Attorney, Agent, or Firm* — Lowe Hauptman Ham & Berner, LLP

(57) ABSTRACT

A Fin field effect transistor (FinFET) includes a fin-channel body over a substrate. A gate electrode is disposed over the fin-channel body. At least one source/drain (S/D) region is disposed adjacent to the fin-channel body. The at least one S/D region is substantially free from including any fin structure.

15 Claims, 11 Drawing Sheets

U.S. PATENT DOCUMENTS

| | | |
|---|---|---|
| 6,858,478 B2 | 2/2005 | Chau et al. |
| 6,872,647 B1 | 3/2005 | Yu et al. |
| 6,964,832 B2 | 11/2005 | Moniwa et al. |
| 7,009,273 B2 | 3/2006 | Inoh et al. |
| 7,018,901 B1 | 3/2006 | Thean et al. |
| 7,026,232 B1 | 4/2006 | Koontz et al. |
| 7,067,400 B2 | 6/2006 | Bedell et al. |
| 7,084,079 B2 | 8/2006 | Conti et al. |
| 7,084,506 B2 | 8/2006 | Takao |
| 7,112,495 B2 | 9/2006 | Ko et al. |
| 7,157,351 B2 | 1/2007 | Cheng et al. |
| 7,190,050 B2 | 3/2007 | King et al. |
| 7,193,399 B2 | 3/2007 | Aikawa |
| 7,247,887 B2 | 7/2007 | King et al. |
| 7,265,008 B2 | 9/2007 | King et al. |
| 7,265,418 B2 | 9/2007 | Yun et al. |
| 7,297,600 B2 | 11/2007 | Oh et al. |
| 7,300,837 B2 | 11/2007 | Chen et al. |
| 7,315,994 B2 | 1/2008 | Aller et al. |
| 7,323,375 B2 | 1/2008 | Yoon et al. |
| 7,338,614 B2 | 3/2008 | Martin et al. |
| 7,351,622 B2 | 4/2008 | Buh et al. |
| 7,358,166 B2 | 4/2008 | Agnello et al. |
| 7,361,563 B2 | 4/2008 | Shin et al. |
| 7,374,986 B2 | 5/2008 | Kim et al. |
| 7,396,710 B2 | 7/2008 | Okuno |
| 7,407,847 B2 | 8/2008 | Doyle et al. |
| 7,410,844 B2 | 8/2008 | Li et al. |
| 7,425,740 B2 | 9/2008 | Liu et al. |
| 7,442,967 B2 | 10/2008 | Ko et al. |
| 7,456,087 B2 | 11/2008 | Cheng |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2 | 5/2009 | Tsai |
| 7,550,332 B2 | 6/2009 | Yang |
| 7,598,145 B2 | 10/2009 | Damlencourt et al. |
| 7,605,449 B2 | 10/2009 | Liu et al. |
| 7,682,911 B2 | 3/2010 | Jang et al. |
| 7,759,228 B2 | 7/2010 | Sugiyama et al. |
| 7,798,332 B1 | 9/2010 | Brunet |
| 7,820,513 B2 | 10/2010 | Hareland et al. |
| 7,851,865 B2 | 12/2010 | Anderson et al. |
| 7,868,317 B2 | 1/2011 | Yu et al. |
| 7,898,041 B2 | 3/2011 | Radosavljevic et al. |
| 7,923,339 B2 | 4/2011 | Meunier-Beillard et al. |
| 7,960,791 B2 | 6/2011 | Anderson et al. |
| 7,989,846 B2 | 8/2011 | Furuta |
| 7,989,855 B2 | 8/2011 | Narihiro |
| 8,003,466 B2 | 8/2011 | Shi et al. |
| 8,043,920 B2 | 10/2011 | Chan et al. |
| 8,076,189 B2 | 12/2011 | Grant |
| 8,101,475 B2 | 1/2012 | Oh et al. |
| 2003/0080361 A1 | 5/2003 | Murthy et al. |
| 2003/0234422 A1 | 12/2003 | Wang et al. |
| 2004/0192067 A1 | 9/2004 | Ghyselen et al. |
| 2004/0259315 A1 | 12/2004 | Sakaguchi et al. |
| 2005/0020020 A1 | 1/2005 | Collaert et al. |
| 2005/0082616 A1 | 4/2005 | Chen et al. |
| 2005/0153490 A1 | 7/2005 | Yoon et al. |
| 2005/0170593 A1 | 8/2005 | Kang et al. |
| 2005/0212061 A1 | 9/2005 | Wu et al. |
| 2005/0221591 A1 | 10/2005 | Bedell et al. |
| 2005/0224800 A1 | 10/2005 | Lindert et al. |
| 2005/0266698 A1 | 12/2005 | Cooney et al. |
| 2005/0280102 A1 * | 12/2005 | Oh et al. ............. 257/401 |
| 2006/0038230 A1 | 2/2006 | Ueno et al. |
| 2006/0068553 A1 | 3/2006 | Thean et al. |
| 2006/0091937 A1 | 5/2006 | Do |
| 2006/0105557 A1 | 5/2006 | Klee et al. |
| 2006/0128071 A1 | 6/2006 | Rankin et al. |
| 2006/0138572 A1 | 6/2006 | Arikado et al. |
| 2006/0151808 A1 | 7/2006 | Chen et al. |
| 2006/0166475 A1 | 7/2006 | Mantl |
| 2006/0214212 A1 | 9/2006 | Horita et al. |
| 2006/0258156 A1 | 11/2006 | Kittl |
| 2007/0001173 A1 | 1/2007 | Brask et al. |
| 2007/0015334 A1 | 1/2007 | Kittl et al. |
| 2007/0020827 A1 | 1/2007 | Buh et al. |
| 2007/0024349 A1 | 2/2007 | Tsukude |
| 2007/0029576 A1 | 2/2007 | Nowak et al. |
| 2007/0048907 A1 | 3/2007 | Lee et al. |
| 2007/0076477 A1 | 4/2007 | Hwang et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 * | 6/2007 | Kavalieros et al. ............. 257/368 |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0236278 A1 | 10/2007 | Hur et al. |
| 2007/0241414 A1 | 10/2007 | Narihiro |
| 2007/0254440 A1 | 11/2007 | Daval |
| 2008/0001171 A1 | 1/2008 | Tezuka et al. |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2009/0026540 A1 | 1/2009 | Sasaki et al. |
| 2009/0039388 A1 | 2/2009 | Teo et al. |
| 2009/0066763 A1 | 3/2009 | Fujii et al. |
| 2009/0155969 A1 | 6/2009 | Chakravarti et al. |
| 2009/0166625 A1 | 7/2009 | Ting et al. |
| 2009/0181477 A1 | 7/2009 | King et al. |
| 2009/0239347 A1 | 9/2009 | Ting et al. |
| 2009/0321836 A1 | 12/2009 | Wei et al. |
| 2010/0155790 A1 | 6/2010 | Lin et al. |
| 2010/0163926 A1 | 7/2010 | Hudait et al. |
| 2010/0187613 A1 | 7/2010 | Colombo et al. |
| 2010/0207211 A1 | 8/2010 | Sasaki et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |
| 2011/0256682 A1 | 10/2011 | Yu et al. |
| 2012/0086053 A1 | 4/2012 | Tseng et al. |

FOREIGN PATENT DOCUMENTS

| | | |
|---|---|---|
| CN | 1011459116 | 6/2009 |
| JP | 2007-194336 | 8/2007 |
| KR | 10-2005-0119424 | 12/2005 |
| KR | 1020070064231 | 6/2007 |
| WO | WO2007/115585 | 10/2007 |

OTHER PUBLICATIONS

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

Shikida, Mitsuhiro, et al., "Comparison of Anisotropic Etching Properties Between KOH and TMAH Solutions", IEEE Xplore, Jun. 30, 2010, pp. 315-320.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

90 nm Technology. retrieved from the Internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

* cited by examiner

FINFETS AND METHODS FOR FORMING THE SAME

CROSS-REFERENCE TO RELATED APPLICATIONS

The present application claims priority of U.S. Application Ser. No. 61/247,756, filed on Oct. 1, 2009, which is incorporated herein by reference in its entirety.

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL; 61/405,858, filed Oct. 22, 2010, titled METHODS OF FORMING SEMICONDUCTOR DEVICES; and Ser. No. 12/267,121, filed Nov. 7, 2008, titled FINFET PROCESS COMPATIBLE NATIVE TRANSISTOR.

TECHNICAL FIELD

The present application relates generally to the field of semiconductor devices, and more particularly, to Fin field effect transistors (FinFETs) and methods for forming the FinFETs.

BACKGROUND

The semiconductor integrated circuit (IC) industry has experienced rapid growth. Technological advances in IC materials and design have produced generations of ICs where each generation has smaller and more complex circuits than the previous generation. For example, the semiconductor industry ardently strives to decrease the size of memory cells. One strategy that has been employed includes the use of multiple gate transistors, otherwise known as FinFETs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
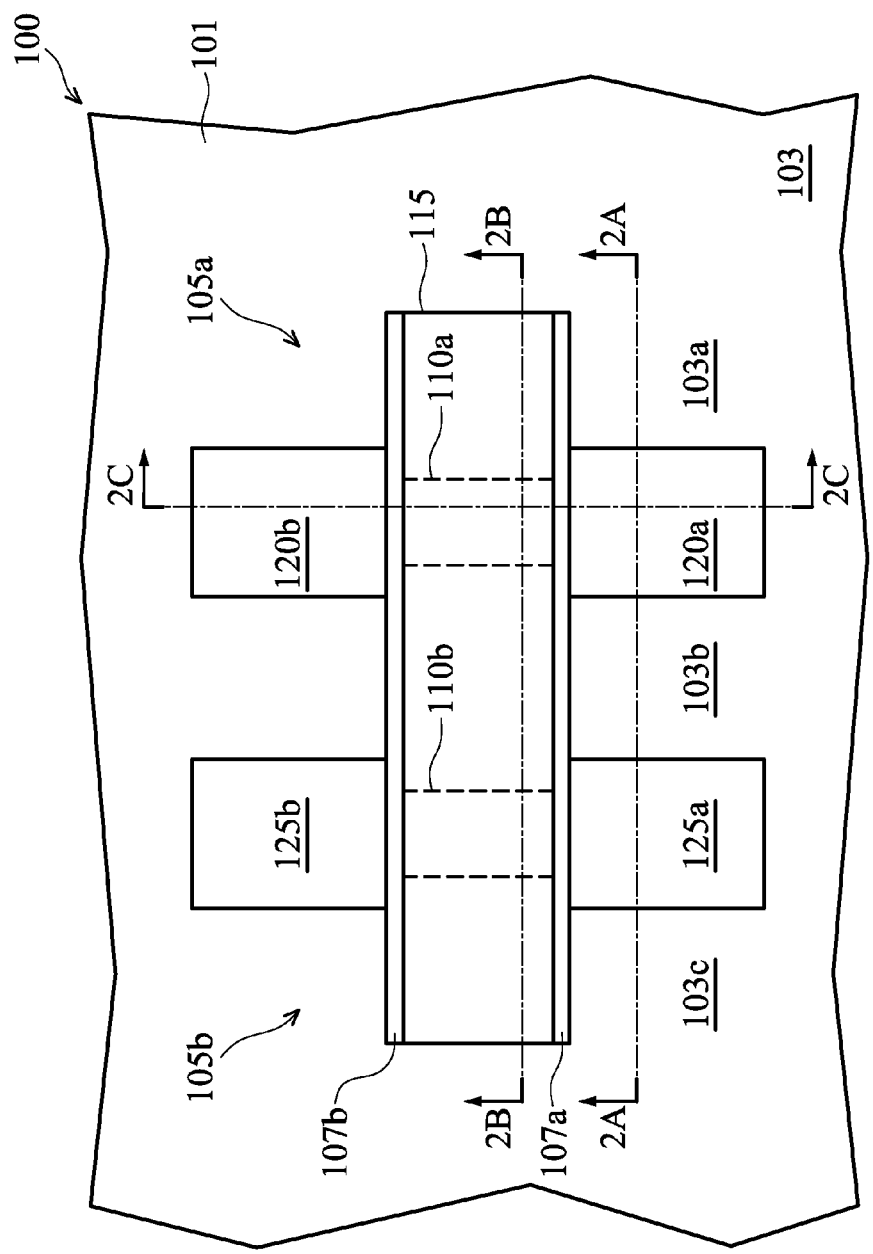
FIG. 1 is a schematic drawing illustrating a top view of an exemplary FinFET of an integrated circuit.

A conventional FinFET device is fabricated using a silicon fin raised from the semiconductor substrate. The channel of the device is formed in the fin, and a gate is provided over (e.g., surrounding) the fin—for example, in contact with the top and the sidewalls of the fin. The gate surrounding the channel (e.g., fin) is beneficial in that allows control of the channel from three sides. Source/drain regions are formed at two ends of the fin.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic drawing illustrating a top view of an exemplary FinFET of an integrated circuit. In FIG. 1, an integrated circuit 100 can include at least one FinFET, e.g., FinFETs 105a and 105b. Each of the FinFETs 105a and 105b can include a fin-channel body, e.g., fin-channel bodies 110a and 110b, respectively, over a substrate 101. A gate electrode 115 can be disposed over the fin-channel bodies 110a and 110b. At least one source/drain (S/D) region, e.g., S/D regions 120a-120b and 125a-125b, disposed adjacent to the fin-channel bodies 110a and 110b, respectively. At least one of the S/D regions 120a and 120b is substantially free from including any fin structure.

It is noted the fin-channel bodies 110a and 110b are below the gate electrode 115. The fin-channel bodies 110a and 110b cannot be seen from the top view of the FinFET 105 and 105b. The fin-channel bodies 110a and 110b are represented with dot lines in FIG. 1 to show their locations in the FinFET 105a and 105b.

In some embodiments, the fin-channel body 110a can mean a body that has a fin structure and is merely used for providing a channel between the S/D regions 120a and 120b. In some other embodiments, the fin-channel body 110a can include a fin body that is merely covered by the gate electrode 115. In still other embodiments, the fin-channel body 110a can include a fin body that is merely covered by the gate electrode 115 and spacers 107a and 107b on sidewalls of the gate electrode 115.

In some embodiments, the substrate 101 may include an elementary semiconductor including silicon or germanium in crystal, polycrystalline, or an amorphous structure; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

Referring to FIG. 1, an isolation structure 103 can include at least one isolation region, e.g., isolation regions 103a-103c. The isolation structure 103 can be disposed around the FinFETs 105a and 105b and electrically isolate the FinFET 105a from the FinFET 105b. The isolation structure 103 can include a shallow trench isolation (STI) structure, a local oxidation of silicon (LOCOS) structure, other isolation structure, or any combination thereof.

Referring to FIG. 1, the spacers 107a and 107b can be disposed adjacent to the gate electrode 115. The spacers 107a and 107b can desirably space the S/D regions 120a, 120b, 125a, and 125b from the gate electrode 115. Each of the spacers 107a and 107b can include at least one material such as oxide, nitride, oxynitride, other dielectric material, or any combinations thereof.

Figure 2A:
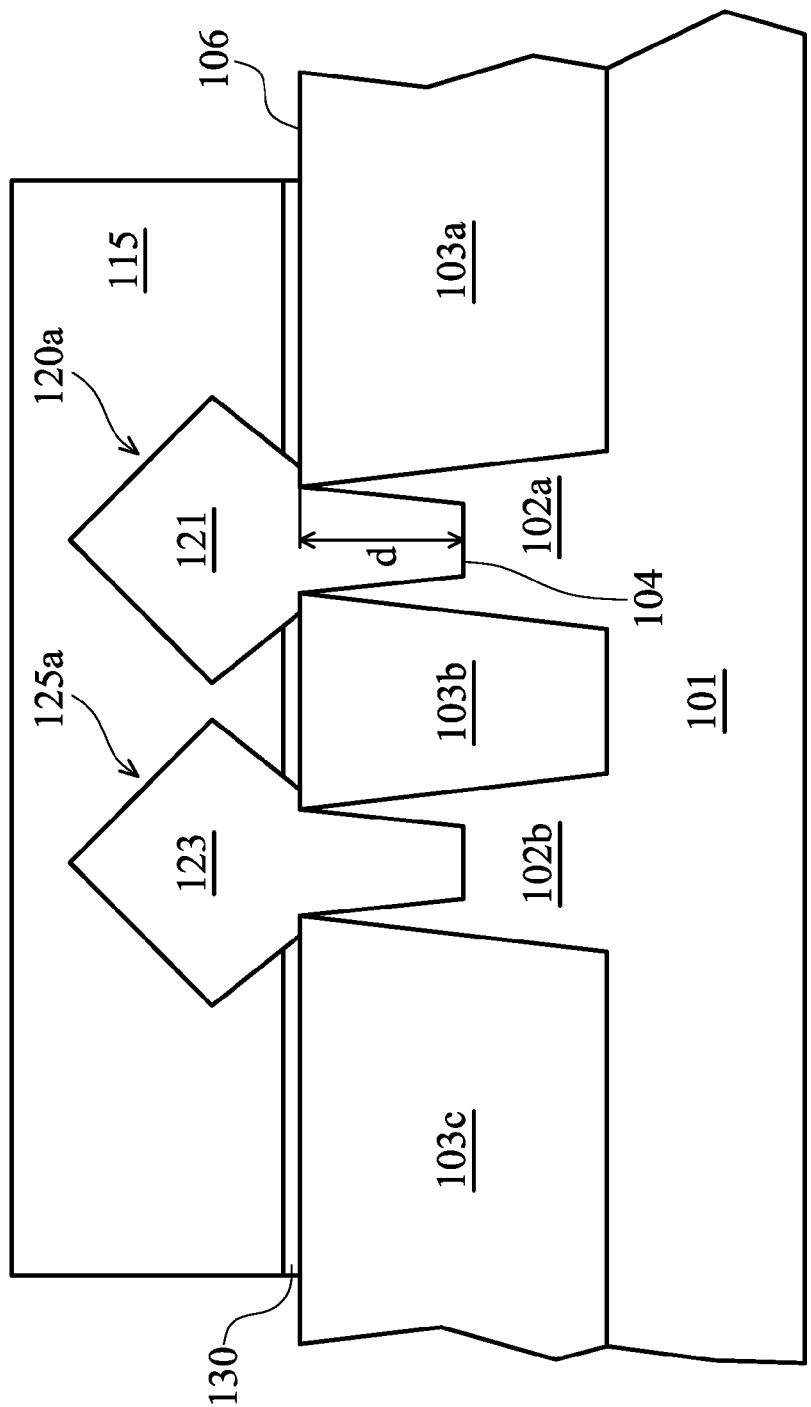
FIG. 2A is a schematic cross-sectional view of the integrated circuit 100 shown in FIG. 1 taken along section line 2A-2A.

FIG. 2A is a schematic cross-sectional view of the integrated circuit 100 shown in FIG. 1 taken along section line 2A-2A. In FIG. 2A, the substrate 101 can include at least one portion, e.g., portions 102a and 102b. In some embodiments, the portion 102a can be disposed between the isolation regions 103a and 103b. A gate dielectric 130 can be disposed below the gate electrode 115. The fin-channel bodies 110a and 110b (shown in FIG. 1) are behind and blocked by the S/D regions 120a and 125a, respectively.

In some embodiments, the gate dielectric 130 can be a single layer or a multi-layer structure. In some embodiments for multi-layer structures, the gate dielectric 130 can include an interfacial layer and a high-k dielectric layer. The interfacial layer can include dielectric material such as, silicon oxide, silicon nitride, silicon oxinitride, other dielectric material, and/or the combinations thereof. The high-k dielectric layer can include high-k dielectric materials such as $HfO_2$, HfSiO, HfSiON, HfTaO, HfTiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof.

In some embodiments, the gate electrode 115 can include polysilicon, silicon-germanium, a metallic material including metal compounds such as, Al, Mo, Cu, W, Ti, Ta, TiN, TaN, NiSi, CoSi, other suitable conductive materials known in the art, or any combination thereof. In other embodiments, the gate electrode 115 can include a polysilicon layer over a metallic layer. In still other embodiments, the gate electrode 115 can include a work function metal layer such that it provides an N-metal work function or P-metal work function of a metal gate. P-type work function materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

In some embodiments, each of the S/D regions 120a and 125a can include an epitaxially-grown region, e.g., epitaxially-grown regions 121 and 123, respectively. The epitaxially-grown region 121 can be disposed over the portion 102a of the substrate 101. The epitaxially-grown region 121 and the portion 102a can have an interface 104. In some embodiments, a central region of the interface 104 can be substantially level with a surface 106 of the isolation region 103a. In other embodiments, the central region of the interface 104 can be below the surface 106 of the isolation region 103a. In still other embodiments, the central region of the interface 104 can be spaced from the surface 106 of the isolation region 103a by a distance "d". In still other embodiments, the central region of the interface 104 can be substantially flat.

In some embodiments, the epitaxially-grown regions 121 and 123 can include dopants. For some embodiments forming N-type FinFET, the epitaxially-grown regions 121 and 123 can have dopants such as Arsenic (As), Phosphorus (P), other group V element, or any combinations thereof. For some embodiments forming P-type FinFET, the epitaxially-grown regions 121 and 123 can have dopants such as boron (B), other group III element, or any combinations thereof. In some embodiments, the epitaxially-grown region 121 and 123 can include a multi-layer structure, e.g., a bi-layer or tri-layer structure. For example, a bi-layer structure can include a SiGe layer below a Si cap layer.

In some embodiments, the FinFET 105a can include a silicide structure (not shown) disposed over the epitaxially-grown regions 121 and 123. The silicide structure may comprise materials such as nickel silicide (NiSi), nickel-platinum silicide (NiPtSi), nickel-platinum-germanium silicide (NiPt-GeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof.

Figure 2B:
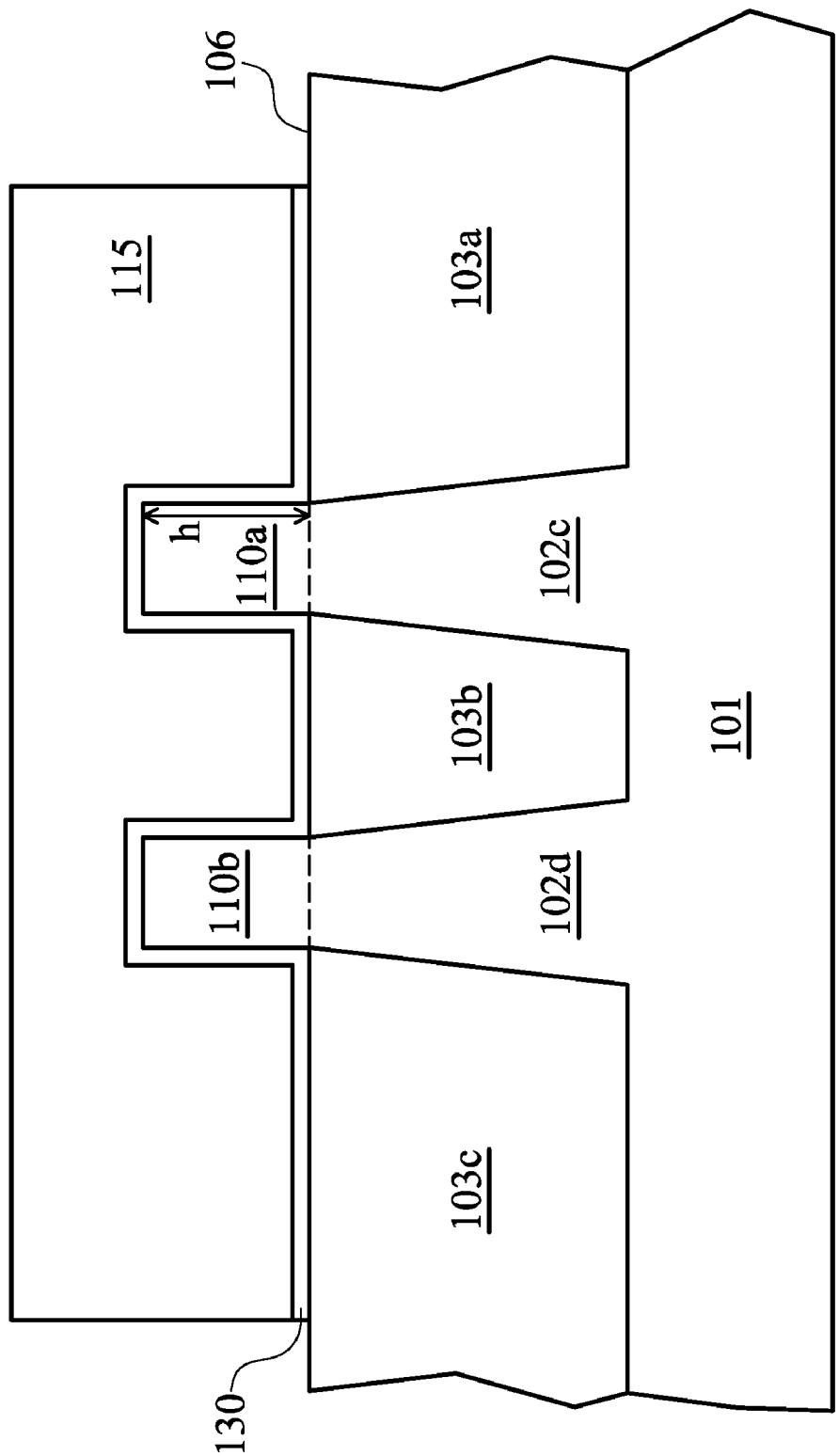
FIG. 2B is a schematic cross-sectional view of the integrated circuit 100 shown in FIG. 1 taken along section line 2B-2B.

FIG. 2B is a schematic cross-sectional view of the integrated circuit 100 shown in FIG. 1 taken along section line 2B-2B. In FIG. 2B, the substrate 101 can include at least one portion, e.g., portions 102c and 102d. The fin-channel body 110a can be disposed over the portion 102c. The fin-channel body 110a can have a height "h". The portion 102c can be disposed between the isolation regions 103a and 103b. The portion 102c can be in connection with the portion 102a (shown in FIG. 2A). In some embodiments, the fin-channel body 110a and the portion 102c can have the same material, e.g., silicon. In other embodiments, the fin-channel body 110a and the portion 102c can have different materials, e.g., SiGe and Si, respectively.

Figure 2C:
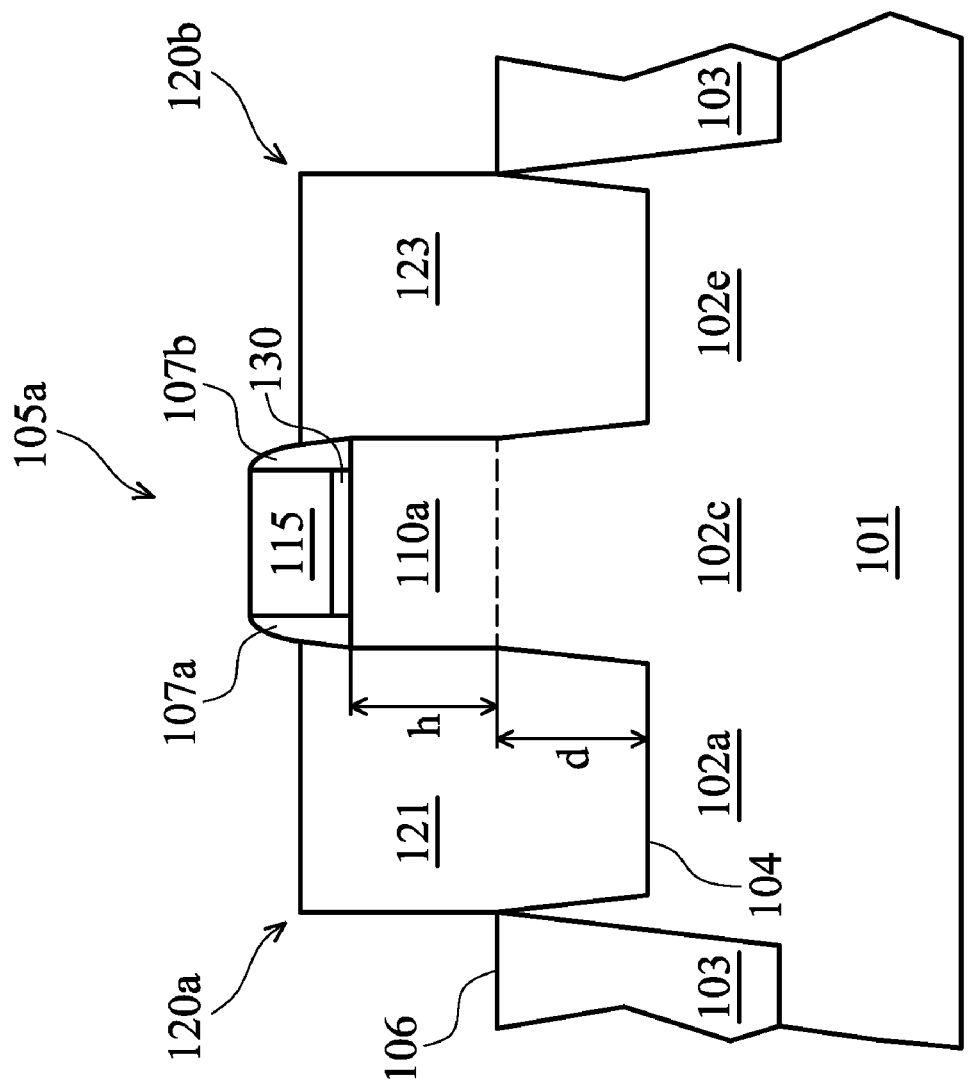
FIG. 2C is a schematic cross-sectional view of the integrated circuit 100 shown in FIG. 1 taken along section line 2C-2C.

FIG. 2C is a schematic cross-sectional view of the integrated circuit 100 shown in FIG. 1 taken along section line 2C-2C. In FIG. 2C, the epitaxially-grown regions 121 and 123 can be disposed over the portions 102a and 102e, respectively, of the substrate 101. The fin-channel body 110a can be disposed over the portion 102c of the substrate 101. As noted, in some embodiments, the interface 104 and the surface 106 of the isolation 103 can have a distance "d". The fin-channel body 110a can have a height "h". In some embodiments, a ratio (d/h) of the distance "d" to the height "h" can be about 10 or less. In at least one embodiment, the ratio (d/h) is about 1.

Referring to FIG. 2C, the epitaxially-grown regions 121 and 123 can provide a stress, e.g., compressive stress or tensile stress, to the fin-channel body 110a. The compressed or tensed fin-channel body 110a can provide a desired electron mobility or hole mobility for the FinFET 105a. In some embodiments providing a compressive stress, the fin-channel body 110a can have a Si material and the epitaxially-grown regions 121 and 123 can have a SiGe material. In other embodiments providing a compressive stress, the fin-channel body 110a and the epitaxially-grown regions 121 and 123 can have a SiGe material. The epitaxially-grown regions 121 and 123 can have a germanium concentration higher than that of the fin-channel body 110a.

In some embodiments providing a tensile stress, the fin-channel body 110a can have a Si material and the epitaxially-grown regions 121 and 123 can have a SiC material. In other embodiments providing a tensile stress, the fin-channel body 110a and the epitaxially-grown regions 121 and 123 can have a SiC material. The epitaxially-grown regions 121 and 123 can have a carbon concentration higher than that of the fin-channel body 110a.

Figure 3:
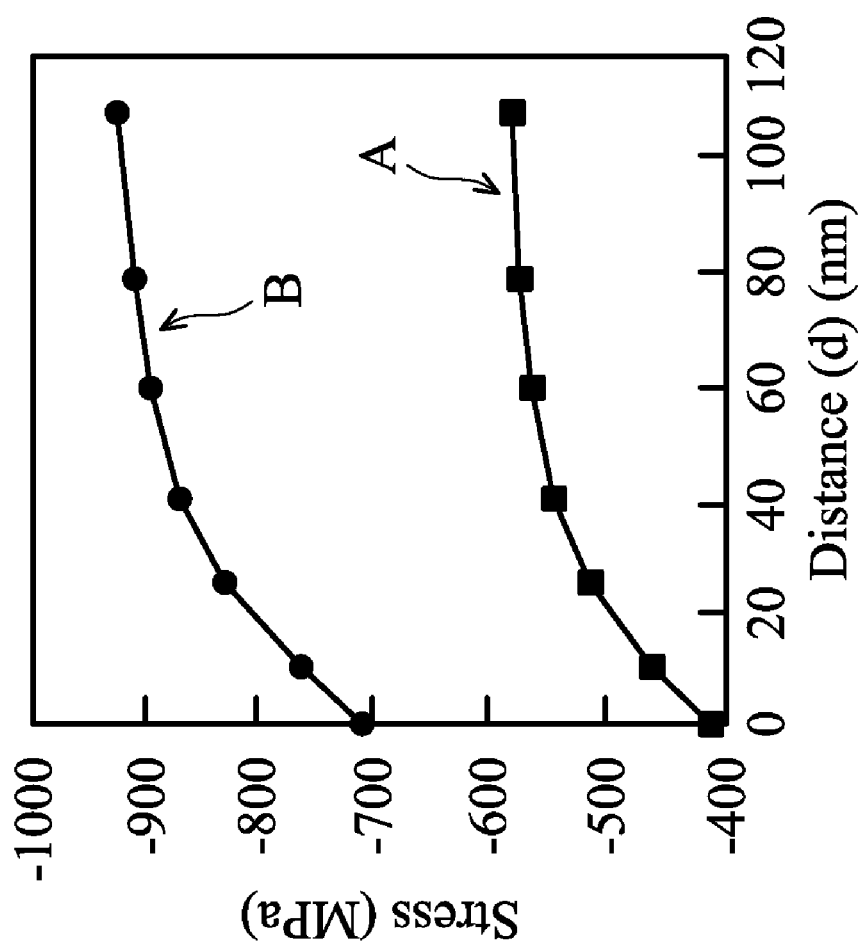
FIG. 3 is a schematic drawing illustrating a simulation result of stress vs. distance (d) of an exemplary FinFET.

FIG. 3 is a schematic drawing illustrating a simulation result of stress vs. distance (d) of an exemplary FinFET according to some embodiments. In FIG. 3, the vertical axis represents a stress applied to a fin-channel body and the horizontal axis represents the distance "d". In the simulation, the fin-channel body 110a has a height "h" of about 40 nm and has a Si material. The epitaxially-grown regions 121 and 123 can have a SiGe material having a germanium concentration of about 36 atomic %. An epitaxial silicon layer (not shown) is formed on each of the epitaxially-grown regions 121 and 123. The curve A represents that the FinFET 105a is formed by a gate-first process. The curve B represents that the FinFET 105a is formed by a gate-last process.

Referring again to FIG. 3, in some embodiments the distance "d" is about 0. The central region of the interface 104 is substantially level with the surface 106 of the isolation region 103a. The stresses of about −400 Mpa and −700 Mpa can be applied to the fin-channel body 110a for the FinFET 105a formed by a gate-first process and a gate-last process, respectively. By increasing the distances "d", the stress is increased for the fin-channel body 110a of the FinFET 105a formed by a gate-first process or a gate-last process (as indicated by arrows A and B). In other embodiments, if the distance "d" is substantially equal to or larger than the height "h", the increase of the stress applied to the fin-channel body 110a for the FinFET 105a can become slow. From the foregoing, the epitaxially-grown regions 121 and 123 are free from including any fin structure. The amount of the epitaxially-grown regions 121 and 123 can provide a desired stress to the fin-channel body 110a for the FinFET 105a.

Figure 4:
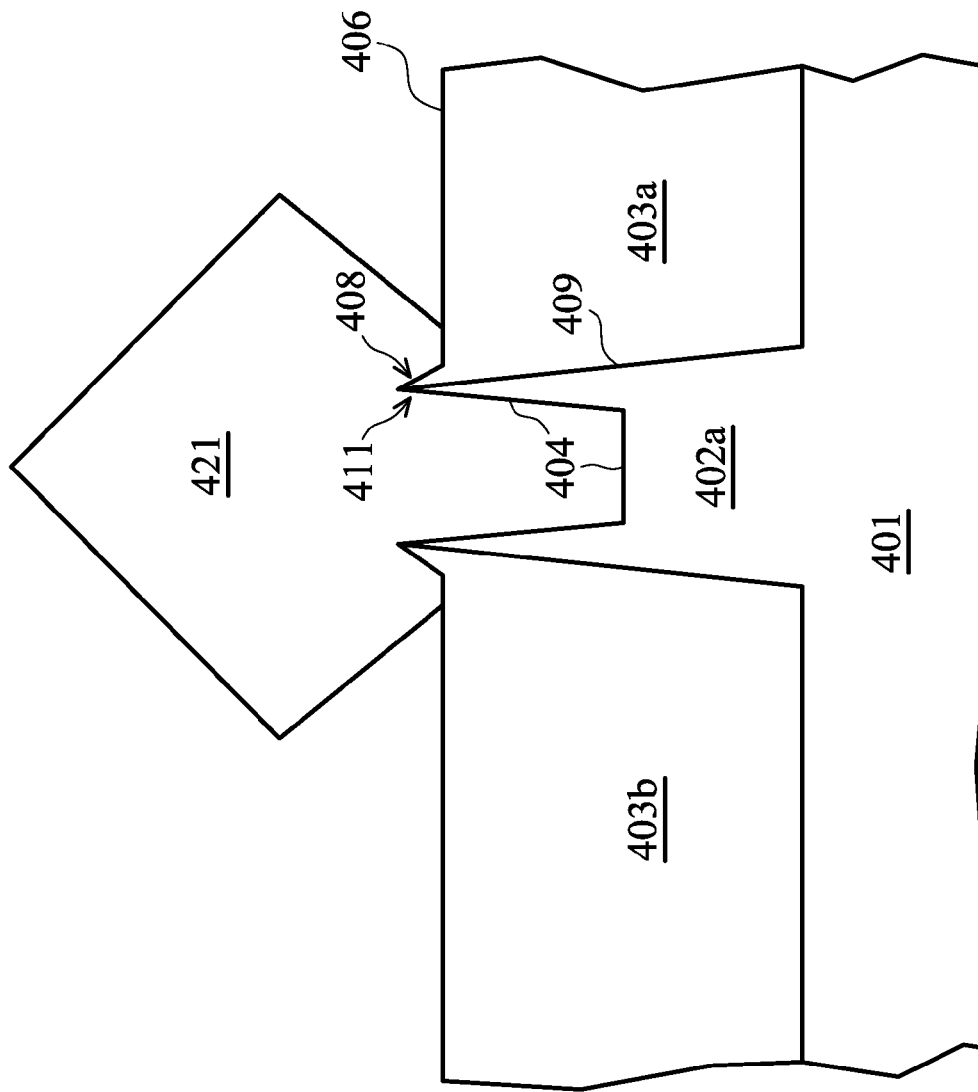
FIG. 4 is an enlarged schematic cross-sectional view of another exemplary FinFET including a portion of the substrate and isolation regions.

FIG. 4 is an enlarged schematic cross-sectional view of another exemplary FinFET including a portion of the substrate and isolation regions. Items of FIG. 4 that are the same items in FIG. 2A are indicated by the same reference numerals, increased by 300. In some embodiments, an isolation region 403a can have a corner 408 where a surface 406 of the isolation region 403a and an interface 409 between the isolation region 403a and the portion 402a of the substrate 401 intersect. The portion 402a of the substrate 401 can have a tip 411 where a surface 404 of the portion 402a of the substrate 401 and the interface 409 between the isolation region 403a and the portion 402a of the substrate 401 intersect. The corner 408 is substantially adjacent to the tip 411. In some embodiments, a process for forming the epitaxially-grown region 421 can include a reflow process in a hydrogen-containing ambient. The reflow process can flat the central portion of the surface 404.

It is found that if the corner 408 is substantially adjacent to the tip 411, a desired amount of the epitaxially-grown region 421 can be formed from the portion 402a of the substrate 401. The desired amount of the epitaxially-grown region 421 can provide a stress to the fin-channel body for the FinFET. The amount of the epitaxially-grown region 421 may also reduce resistances of the source/drain regions. In some embodiments, dopants added in the epitaxially-grown region 421 by an in-situ process can further reduce the resistances of the source/drain regions.

Figure 5A:
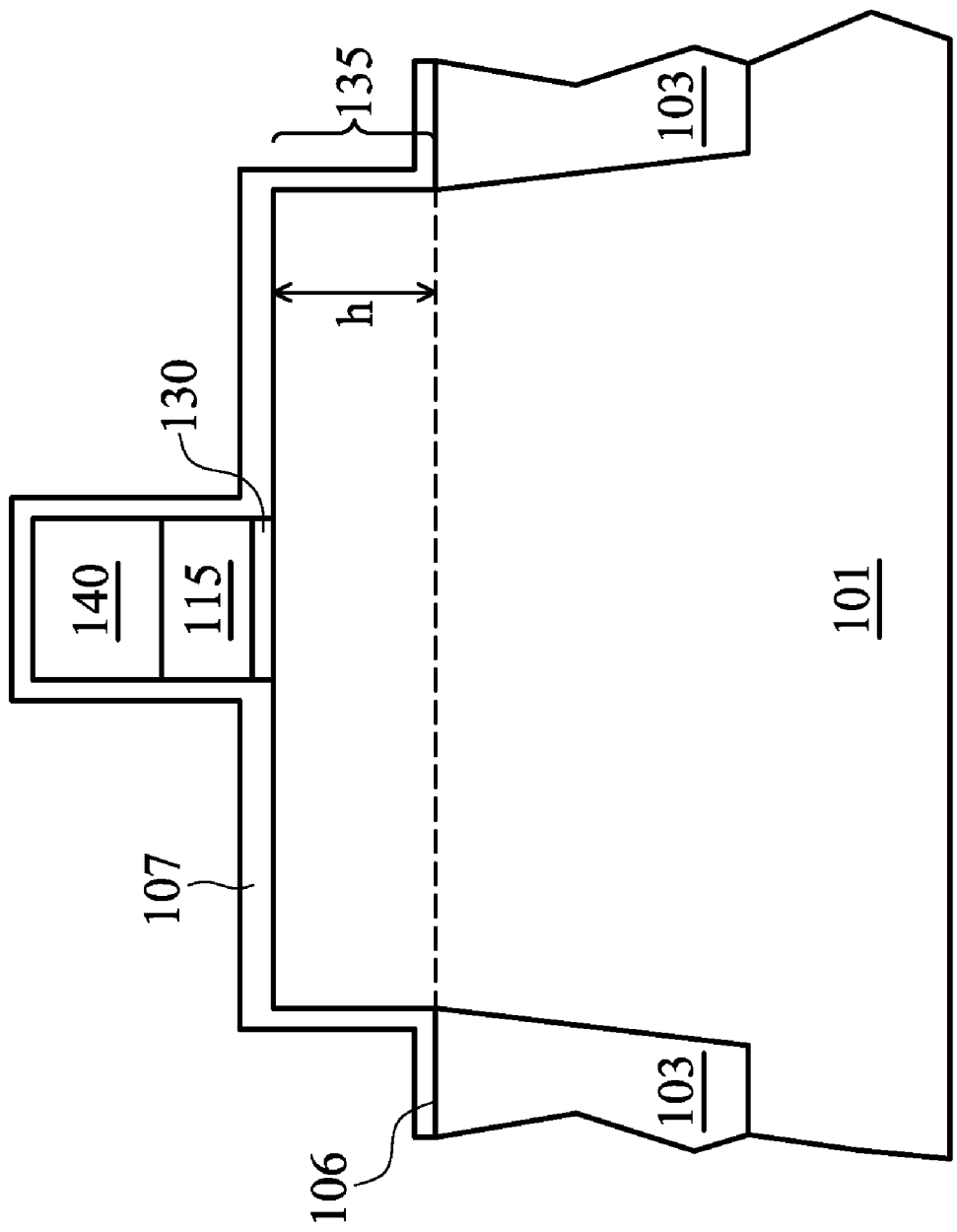
FIGS. 5A-5D are schematic cross-sectional views illustrating an exemplary method for forming the FinFET shown in FIG. 1 taken along section line 2C-2C.

FIGS. 5A-5D are schematic cross-sectional views illustrating an exemplary method for forming the FinFET shown in FIG. 1 taken along section line 2C-2C. In FIG. 5A, the isolation structure 103 can be formed within and/or over the substrate 101. A fin 135 can be formed over the substrate 101. The fin 135 can have a height "h". The gate dielectric 130 and the gate electrode 115 can be formed over the fin 135. A hard-mask layer 140 can be formed over the gate electrode 115. A spacer layer 107 can be formed substantially conformal over the fin 135, the hard-mask layer 140, and sidewalls of the gate electrode 115 and the gate dielectric 130. The isolation structure 103, the gate dielectric 130, the gate electrode 115, the spacer layer 107, the fin 135, and/or the hard-mask layer 140 can be formed by processes including, for example, deposition process, etch processes, clean process, lithographic process, and/or any combinations thereof.

Figure 5B:
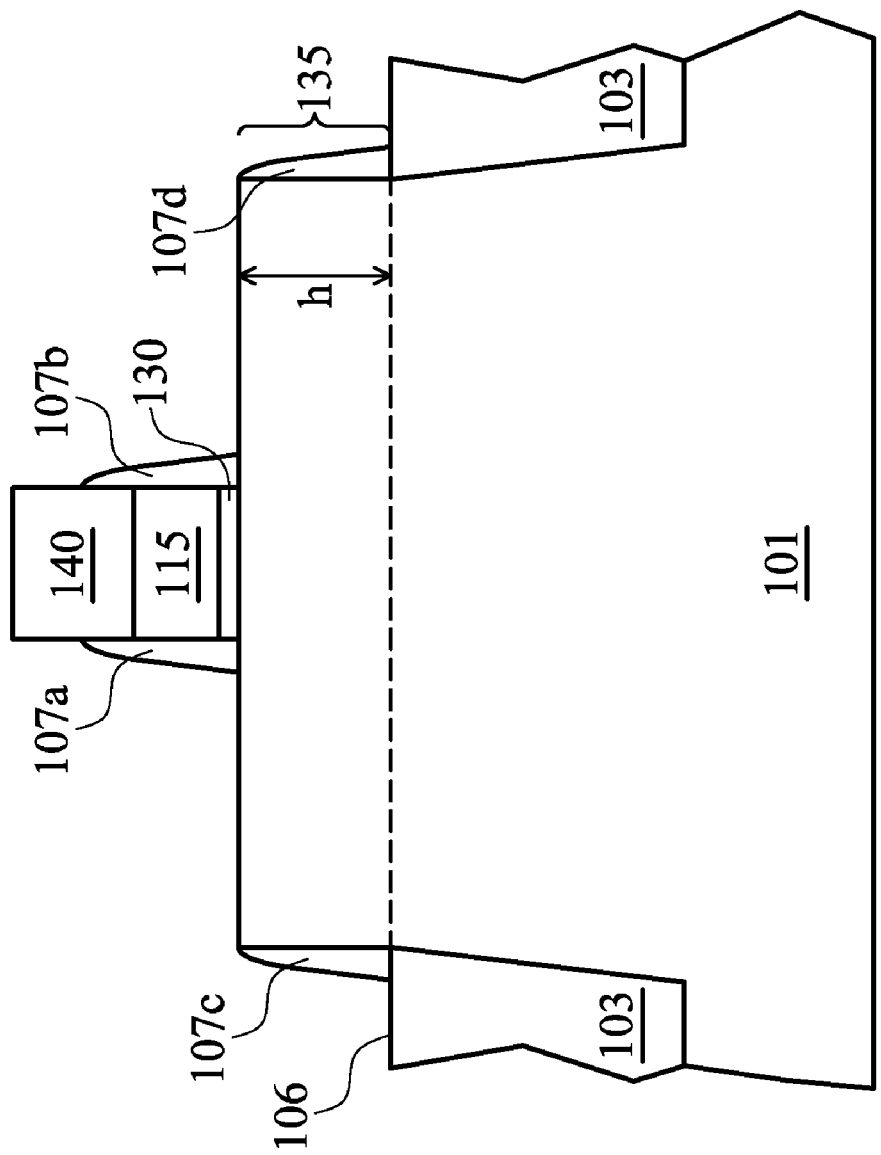

Referring to FIG. 5B, portions of the spacer layer 107 (shown in FIG. 5A) can be removed for forming the spacers 107a-107d. The spacers 107a and 107b can be formed on the sidewalls of the gate electrode 115. Spacers 107c and 107d can be formed on the sidewalls of the fin 135. In some embodiments, the spacers 107a and 107b can cover the gate electrode 115 to avoid a mushroom effect resulting from an epitaxy-growth from the sidewalls of the gate electrode 115. The isolation structure 103, the gate dielectric 130, the gate electrode 115, the spacers 107a and 107b, the fin 135, and/or the hard-mask layer 140 can be formed by processes including, for example, deposition process, etch processes, clean process, lithographic process, and/or any combinations thereof.

Figure 5C:
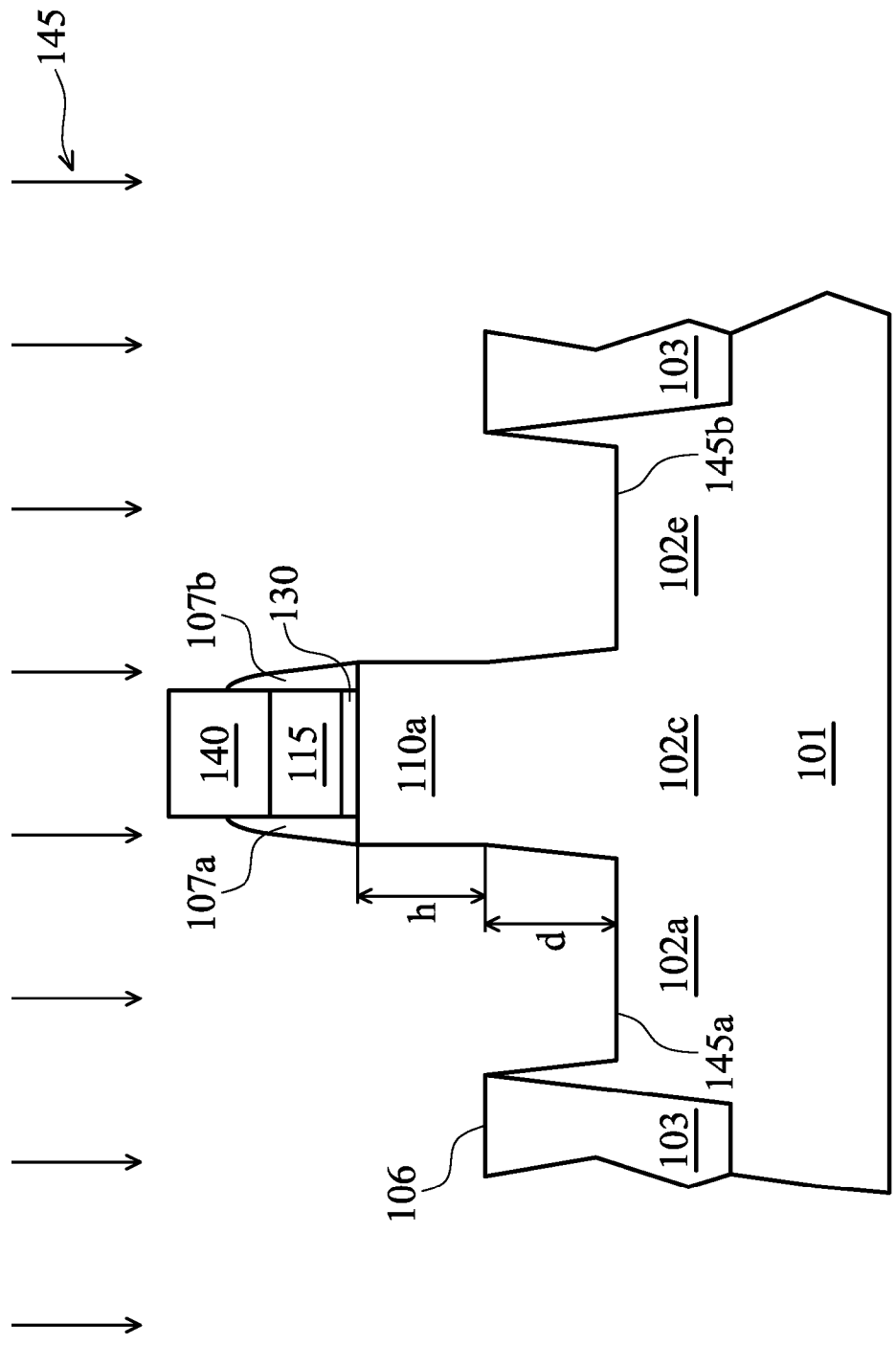

Referring FIG. 5C, a removing process 145 can remove at least a portion of the fin 135 to expose the surfaces 145a of the portion 102a and 145b of the portion 102e of the substrate 101 and to define the fin-channel body 110a. The removing process 145 can also remove the spacers 107c and 107d. In some embodiments, the removing process 145 can substantially remove the portion of the fin 135 such that a central region of the exposed surface 145a can be substantially level with the surface 106 of the isolation structure 103. In other embodiments, the removing process 145 can remove a portion of the substrate 101 such that the central region of the exposed surface 145a can be below the surface 106 of the isolation structure 103. The distance "d" can be defined between the exposed surface 145a and the surface 106 of the isolation structure 103. A ratio (d/h) of the distance "d" to the height "h" can be about 10 or less. In at least one embodiment, the ratio (d/h) can be about 1.

Figure 6:
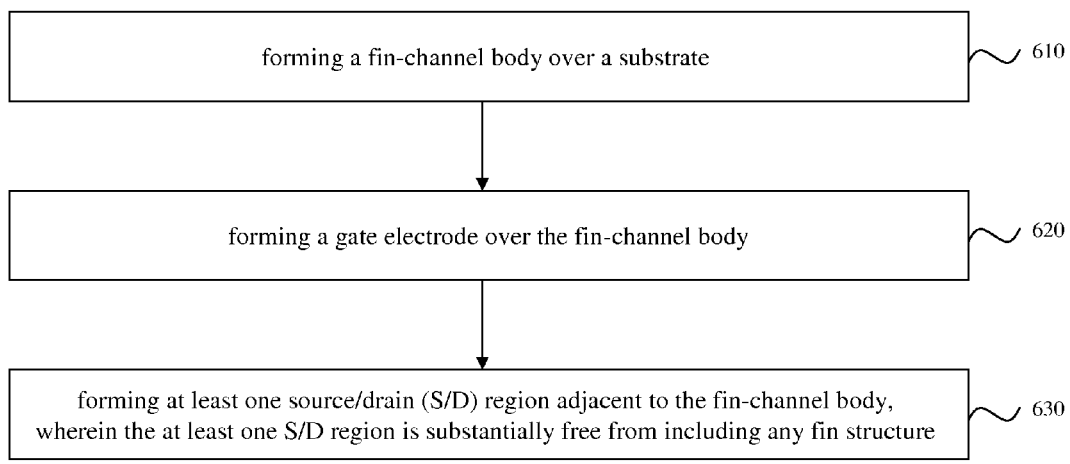
FIG. 6 is a schematic drawing illustrating an exemplary method of forming an exemplary FinFET.

In some embodiments, the process steps described above in conjunction with FIGS. 5A-5C can be referred to as processes of forming the fin-channel body 145a over the substrate 101 and forming the gate electrode 115 over the fin-channel body 145a (processes 610 and 620 shown in FIG. 6). In other embodiments, the process 610 can include one or more known semiconductor processing steps for forming the fin-channel body 145a. In still other embodiments, one or more step described above in conjunction with FIGS. 5A-5C can be saved for performing the processes 610 and 620.

Figure 5D:
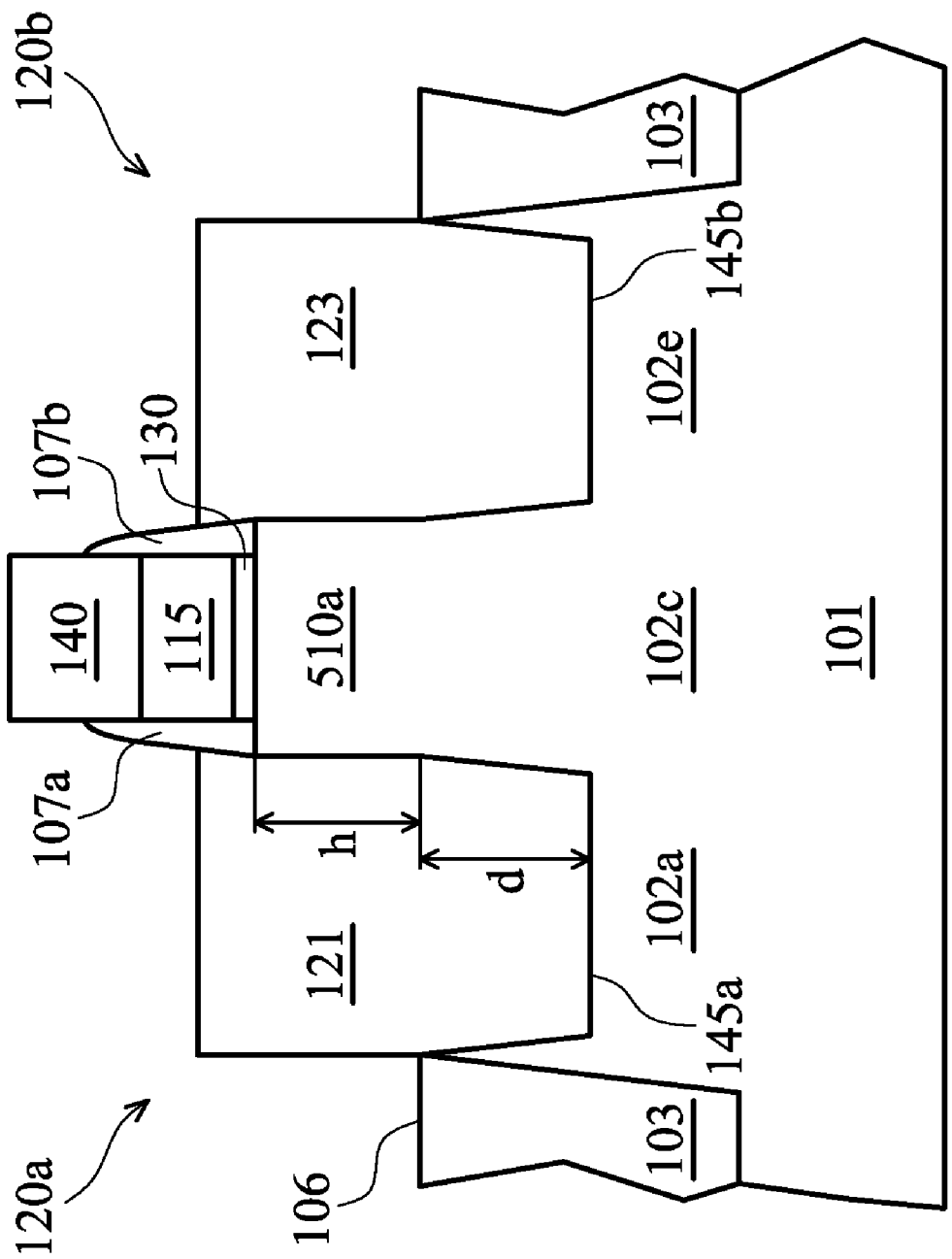

Referring to FIG. 5D, at least one source/drain (S/D) region, e.g., the S/D regions 120a and 120b can be formed adjacent to the fin-channel body 110a. In some embodiments, forming the S/D regions 120a and 120b can include epitaxially growing the epitaxially grown-regions 121 and 123, respectively, from the exposed surface 145a of the portion 102a and the exposed surface 145b of the portion 102e of the substrate 101. In some embodiments, each of the epitaxially grown-regions 121 and 123 can have a (1 0 0) facet.

In some embodiments, the process steps described above in conjunction with FIG. 5A-5D can be referred to as a process of forming at least one source/drain (S/D) region adjacent to the fin-channel body, wherein the at least one S/D region is substantially free from including any fin structure (process 630 shown in FIG. 6).

In some embodiments, the method for forming the FinFET 100 can include implanting dopants within the S/D regions 120a and 120b. For embodiments forming N-channel memory cells, the S/D regions 120a and 120b can have dopants such as Arsenic (As), Phosphorus (P), other group V element, or the combinations thereof.

In other embodiments, the method for forming the FinFET 100 can include salicidating at least a portion of the epitaxially-grown regions 121 and 123. The silicide of the epitaxially-grown regions 121 and 123 can provide a desired conductivity. The silicide may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a Rapid Thermal Process (RTP). The reacted silicide may require a one step RTP or multiple step RTPs.

In some embodiments, the method for forming the FinFET 100 can include forming an epitaxial layer (not shown), e.g., a silicon epitaxial layer, over each of the epitaxially-grown regions 121 and 123. After the formation of the silicon epitaxial layer, the method can include salicidating at least a portion of the epitaxial layer. It is found that the silicide formed from the silicon epitaxial layer can desirably reduce defects of the silicide. A desired conductivity of the silicide can be reached.

In other embodiments, the method for forming the FinFET 100 can include an etch process (not shown) for removing a portion of the substrate 101. The etch process can include, for example, a dry etch, a wet etch, and/or any combinations thereof. The etch process can be performed after the removing process 145 described above in conjunction with FIG. 2B and/or before the forming the epitaxially-grown regions 121 and 123 described above in conjunction with FIG. 2C. In some embodiments, after the removing process 145, a top corner of the isolation structure 103 may be higher than a tip of the portion 102a of the substrate 101. The etch process can remove the portion of the substrate 101 such that a corner of the isolation structure 103 is substantially adjacent to a tip of the portion 102a of the substrate 101 as described above in conjunction with FIG. 4. The substantially-leveled corner and tip can let a desired amount of the epitaxially-grown regions 121 and 123 formed from the exposed surfaces 145a and 145b, respectively. The desired amount of the epitaxially-grown regions 121 and 123 can provide a desired stress to the fin-channel body 110a.

In still other embodiments, the method for forming the FinFET 100 can include reflowing the exposed surfaces 145a and 145b of the substrate 101 such that the central region of the exposed surfaces 145a and 145b of the substrate are substantially flat. The substantially flat central regions of the exposed surfaces 145a and 145b can let the epitaxially-grown regions 121 and 123 desirably formed from the exposed surfaces 145a and 145b, respectively. In some embodiments, reflowing the exposed surfaces 145a and 145b can be performed in a hydrogen-containing ambient and at a processing temperature between about 600° C. and about 800° C. for about 30 minutes.

In some embodiments, at least one dielectric structure (not shown) can be formed over the substrate. The dielectric structure may include materials such as oxide, nitride, oxynitride, low-k dielectric material, ultra low-k dielectric material, or any combinations thereof. The dielectric structure may be formed by, for example, a CVD process, a HDP CVD process, a HARP, a spin-coating process, other deposition process, and/or any combinations thereof.

In some embodiments, contact plugs, via plugs, metallic regions, and/or metallic lines can be formed within the dielectric structure for interconnection. The contact plugs, via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The contact plugs, via plugs, metallic regions, and/or metallic lines can be formed by any suitable processes, such as deposition, photolithography, and etching processes, and/or combinations thereof. It is noted that the method described above in conjunction with FIGS. 5A-5D are merely exemplary. The method can be a gate-first process or a gate-last process. The scope of the invention is not limited thereto.

In some embodiments, the FinFETs 105a and/or 105b can be formed within a package which can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system including the integrated circuit 100 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Fin field effect transistor (FinFET) comprising:
a fin-channel body over a substrate;
a gate electrode disposed over the fin-channel body; and
at least one source/drain (S/D) region disposed adjacent to the fin-channel body, the at least one S/D region being substantially free from including any fin structure, wherein
the substrate has a portion between a first isolation region and a second isolation region, the at least one S/D region includes an epitaxially-grown region, and the epitaxially-grown region is disposed over the portion of the substrate, and
the first isolation region has a corner where a surface of the first isolation region and an interface between the first isolation region and the portion of the substrate intersect, the portion of the substrate has a tip where a surface of the portion of the substrate and the interface between the first isolation region and the portion of the substrate intersect, and the corner is substantially adjacent to the tip.

2. The FinFET claim 1, wherein the epitaxially-grown region and the portion of the substrate have an interface and a central region of the interface is below a surface of the first isolation region.

3. The FinFET of claim 2, wherein a distance between the central region of the interface and the surface of the first isolation region is substantially equal to a height of the fin-channel body.

4. The FinFET of claim 2, wherein the central region of the interface is substantially flat.

5. The FinFET claim 1, wherein the epitaxially-grown region is configured for providing a stress to the fin-channel body.

6. The FinFET claim 1, further comprising a silicide structure disposed over the epitaxially-grown region.

7. A Fin field effect transistor (FinFET) comprising:
a fin-channel body over a substrate, the substrate having a portion between a first isolation region and a second isolation region;
a gate electrode disposed over the fin-channel body; and
at least one source/drain (S/D) region disposed adjacent to the fin-channel body, the at least one S/D region comprising:
an epitaxially-grown region disposed over the portion of the substrate, wherein the epitaxially-grown region and the portion of the substrate has an interface and a central region of the interface is below a surface of the first isolation region; and
a silicide structure disposed over the epitaxially-grown region,
wherein the first isolation region has a corner where the surface of the first isolation region and a sidewall of the first isolation region intersect, the portion of the substrate has a tip where a surface of the portion of the substrate and a sidewall of the portion of the substrate intersect, and the corner is substantially adjacent to the tip.

8. The FinFET of claim 7, wherein a distance between the central region of the interface and the surface of the first isolation region is substantially equal to a height of the fin-channel body.

9. The FinFET of claim 7, wherein the central region of the interface is substantially flat.

10. The FinFET of claim 7, wherein the epitaxially-grown region is capable of providing a stress to the fin-channel body.

11. A method for forming a Fin field effect transistor (FinFET), the method comprising:
forming a fin over a substrate, and removing at least one end portion of the fin to expose a surface of a portion of the substrate surrounded by first and second isolation regions to form a fin-channel body over the substrate, wherein the first isolation region has a corner where a surface of the first isolation region and a sidewall of the first isolation region intersect, the portion of the substrate has a tip where a surface of the portion of the substrate and a sidewall of the portion of the substrate intersect, and the corner is substantially adjacent to the tip;
forming a gate electrode over the fin-channel body; and
epitaxially growing at least one S/D region from the exposed surface of the portion of the substrate to form the at least one source/drain (S/D) region adjacent to the fin-channel body, the at least one S/D region being substantially free from including any fin structure.

12. The method of claim 11, further comprising removing a portion of the substrate, wherein a central region of the exposed surface of the portion of the substrate is below a surface of the first isolation region.

13. The method of claim 12, wherein a distance between the central region of the exposed surface of the substrate and the surface of the first isolation region is substantially equal to a height of the fin-channel body.

14. The method of claim 12 further comprising reflowing the exposed surface of the substrate such that the central region of the exposed surface of the substrate is substantially flat.

15. The method of claim 11, further comprising:
forming an epitaxial layer over the at least one S/D region; and
salicidating at least one of the epitaxial layer.

* * * * *